United States Patent [19]

Gilbert et al.

[11] Patent Number: 5,519,886

[45] Date of Patent: May 21, 1996

[54] METHOD AND APPARATUS FOR CONTROLLING DEVICE TEMPERATURE DURING TRANSMISSIONS

[75] Inventors: Stephen S. Gilbert, Lake Zurich; Michael L. Needham, Palatine, both of Ill.

[73] Assignee: Motorola, Inc., Schaumburg, Ill.

[21] Appl. No.: 325,839

[22] Filed: Oct. 19, 1994

Related U.S. Application Data

[63] Continuation-in-part of Ser. No. 312,378, Sep. 26, 1994.

[51] Int. Cl.⁶ .............................. H03C 1/62; H04B 17/00
[52] U.S. Cl. ....................... 455/115; 455/117; 455/67.1; 455/127
[58] Field of Search ............................ 455/67.1, 95, 115, 455/117, 127, 8, 9; 330/289, 298, 207 P; 361/694, 695, 688, 696, 697

[56] References Cited

U.S. PATENT DOCUMENTS

| | | | |
|---|---|---|---|
| 4,742,312 | 5/1988 | Osburn et al. | 330/298 |
| 4,792,766 | 12/1988 | Wieschhoff et al. | 330/298 |
| 4,939,786 | 7/1990 | McCallum et al. | 455/115 |
| 5,020,138 | 5/1991 | Yasuda et al. | 455/115 |
| 5,117,504 | 5/1992 | Dennerlein et al. | 455/67.1 |
| 5,192,919 | 3/1993 | Wieczorek | 330/129 |
| 5,249,741 | 10/1993 | Bistline | 361/694 |
| 5,357,089 | 10/1994 | Prentice | 330/207 P |

*Primary Examiner*—Reinhard J. Eisenzopf
*Assistant Examiner*—Marsha D. Banks-Harold
*Attorney, Agent, or Firm*—Andrew S. Fuller

[57] ABSTRACT

A communication device (200) supporting transmissions provides transmission related device temperature control. The communication device (200) has a particular portion (244) subject to an increase in temperature resulting from the transmissions. A message is provided for transmission by the communication device (200) which has a data communication protocol (224) governing message transmission. Temperature control is effected by determining temperature information for the particular portion (244) of the communication device (200) and by modifying operation of the data communication protocol (224) based in part on the temperature information.

25 Claims, 3 Drawing Sheets

5,519,886

METHOD AND APPARATUS FOR CONTROLLING DEVICE TEMPERATURE DURING TRANSMISSIONS

CROSS REFERENCE TO RELATED APPLICATIONS

This application is a continuation-in-part of prior U.S. application Ser. No. 08/312,378, filed Sep. 26, 1994, by Gilbert, et al., and assigned to Motorola, Inc.

TECHNICAL FIELD

This invention relates in general to communication devices, and more particularly, to temperature control in communication devices.

BACKGROUND

Wireless communication devices typically include electrical modules or individual components which generate an appreciable amount of heat. For example, a portable two-way radio includes a radio-frequency power amplifier which amplifies signals to be transmitted through an antenna. Power amplifiers tend to be inefficient, and high capacity power amplifiers can generate substantial heat. Ordinarily, the portable two-way radio includes a heat sink situated in close proximity to the power amplifier to provide for heat dissipation. The heat sink protects the power amplifier, and surrounding components, from damage due to excessive heat. With the increasing miniaturization of communication devices, it has become more difficult to ensure that critical components within the communication devices are protected from excessive heat through appropriate heat dissipation paths.

A typical digital TDMA portable two-way radio used for voice communications employs transmissions which are characterized by short, bursty, periodic transmissions. Many communication devices now support the transmission of data which, depending on the data communication protocol, may result in long periods of continuous transmissions. Whether transmitting data or voice, a communication device may experience a substantial increase in temperature if heat generated during the transmission exceeds the heat dissipation capability of the communication device. Long continuous transmissions, or consecutive shorter transmissions, can result in sufficient heat to overcome the heat dissipation protection of the device, and damage critical components within the device.

It is desirable to avoid overheating conditions in a communication device which could ultimately cause damage to internal components, or which could reduce performance of the communication device. Therefore, a need exists to provide temperature control for data communication devices.

DETAILED DESCRIPTION OF THE PREFERRED EMBODIMENT

Figure 1:
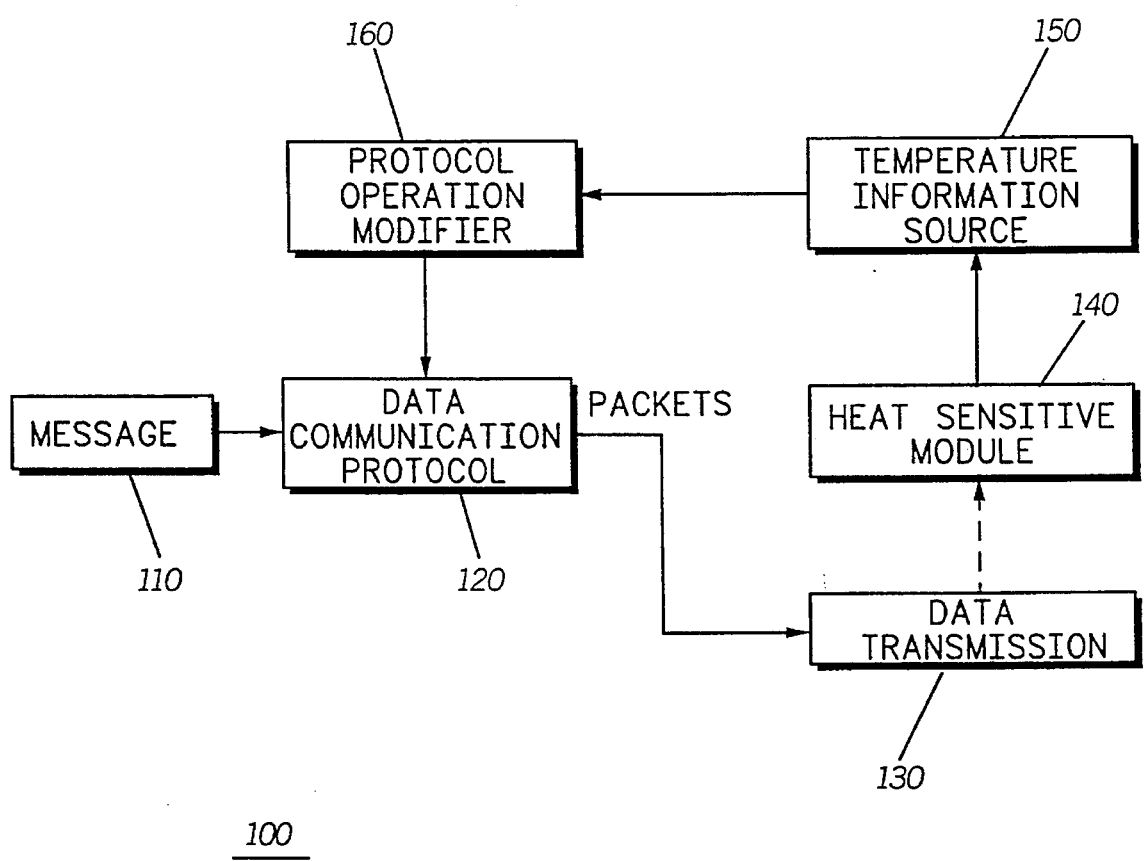
FIG. 1 is a block representation of temperature control in a communication device, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring to FIG. 1, a block diagram 100 summarizes temperature control in a communication device, in accordance with the present invention. In the communication device, a message 110 is obtained for transmission over a communication link, such as communication link established on a wireless radio frequency carrier. The message transmission is governed by a data communication protocol 120, which controls the parameters of data transmission over the communication link. The message is digitally processed to produce packets of data for transmission by a data transmission block 130. The transmissions tend to increase the temperature of a heat sensitive module 140. A temperature information source 150 provides temperature information regarding the heat sensitive module 140 to a protocol operation modifier 160. According to the invention, temperature control is provided by manipulation of the operation of the data communication protocol 120 using temperature information 150 regarding the heat sensitive module 140. The operation of the data communication protocol 120 is modified in order to reduce the temperature effects on the heat sensitive module 140 due to transmissions.

Figure 2:
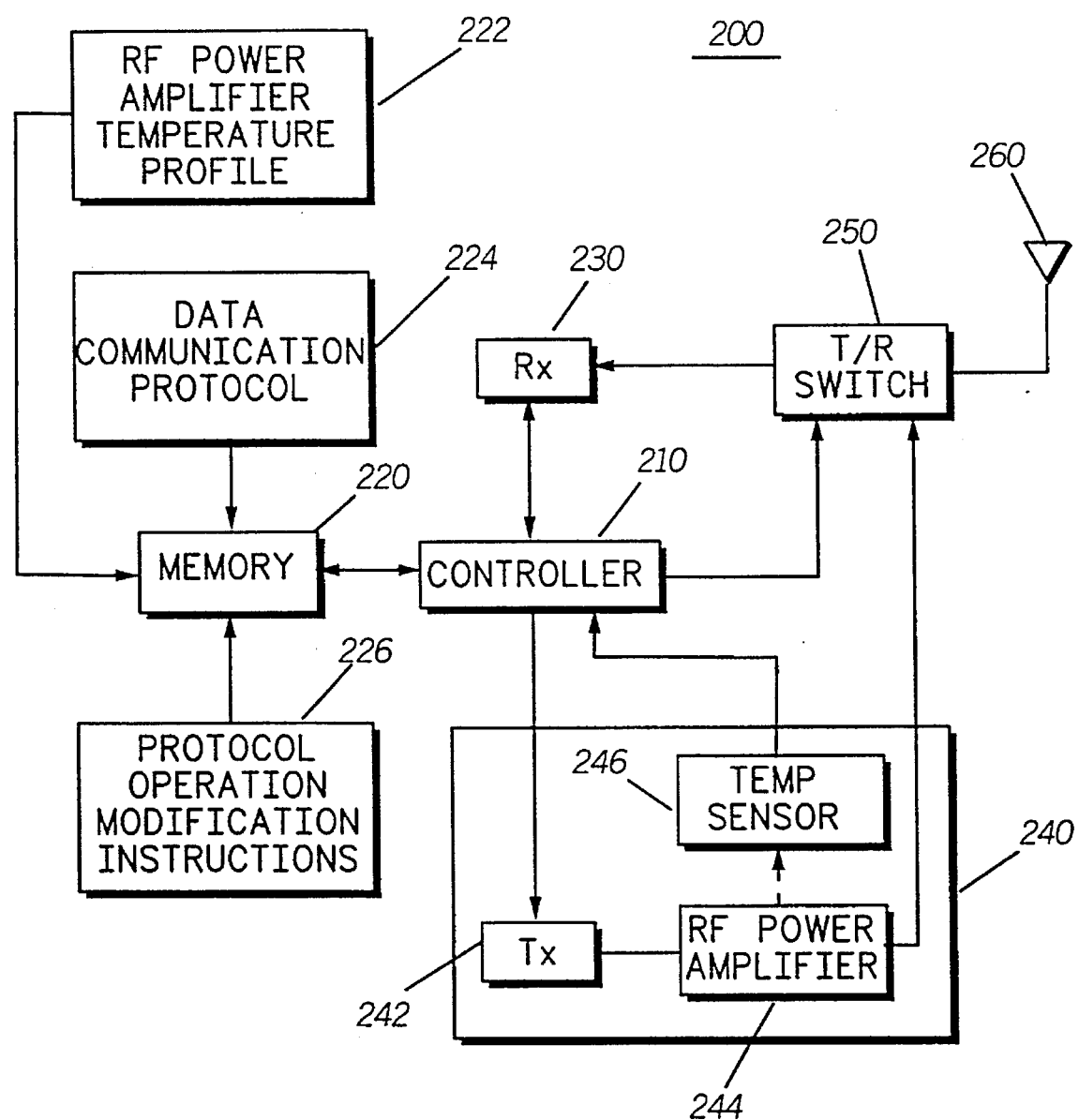
FIG. 2 is a block diagram of a communication device, in accordance with the present invention.

FIG. 2 is a block diagram of a communication device 200, in accordance with the present invention. The communication device 200 has a controller 210 to provide operational control for the functions of the communication device 200, including the provision of temperature control for heat sensitive portions thereof. The communication device 200 is capable of receive and transmit operations. For receive operations, a transmit/receive switch 250 is engaged to selectively couple an antenna 260 to a receiver 230. The controller 210 is coupled to the receiver 230, and operates to control the receiver 230 to selectively receive signals. Transmission operations are supported through a data transmission block 240. The controller is coupled to a transmitter 242, and operatively controls the transmitter 242 during transmissions. For transmit operations, the transmit/receive switch 250 is engaged so as to couple the transmitter to the antenna 260 through a radio frequency (RF) power amplifier 244. Signals transmitted by the transmitter 242 are amplified by the RF power amplifier 244 and radiated through the antenna 260. The data transmission portion 240 also includes a temperature sensor 246 in close proximity to the RF power amplifier 244, which measures the temperature of heat sensitive components and/or modules which may be affected by transmissions. The RF power amplifier 244 represents one such heat sensitive module, and the temperature sensor 246 represents a temperature information source which provides temperature information regarding the RF power amplifier 244 to the controller 210. The controller is also coupled to a memory 220, which includes a data communication protocol 224, data communication protocol operation modification instructions 226, and an RF power amplifier temperature profile 222. The protocol operation modification instructions 226 include instructions for delaying transmission of at least a portion of a message, and/or instructions for segmenting a message.

The temperature profile 222, which is stored in memory, contains information regarding the relationship between transmissions and temperature increases, and other related information for the RF power amplifier 244 during transmission. The temperature profile 222 includes predetermined and other data relating to the expected temperature state of the RF power amplifier 244 or surrounding components based on inherent characteristics and transmission duration. For example, the temperature profile 222 contains a heat generation rate and a heat dissipation rate for the RF power amplifier 244. The temperature profile also includes time periods for previous transmissions, such as commencement and cease times for the previous transmissions. With additional information regarding the RF power amplifier 244, such as measured or assumed environmental ambient temperature, temperature information can be derived. Thus, the temperature profile 222 represents a source of temperature information regarding the RF power amplifier 244.

The data communication protocol 224 governs transmission of messages by the communication device 200. In the preferred embodiment the data communication protocol 224 is implemented using a Packet Data Protocol (PDP), which incorporates principles well known in the art. The PDP is a set of rules governing communications over one or more communication channels. Typically the communication channels are implemented using wireless carrier frequencies. The PDP is a packet-switched protocol, in which data messages from different sources are sent over a common communication channel to different destinations. Messages are segmented into protocol blocks which are combined to form data packets for transmission. A single message may require the transmission of several packets depending on the length of the message. The transmission rates for data packets may vary depending on channel availability, the channel access protocol, and other factors. In the preferred embodiment, a time division multiplex (TDM) channel protocol is used to allocate a plurality of slots on a communication channel for use by the communication device. Depending on channel availability and other factors, contiguous or interspersed TDM slots may be available for the communication device. The PDP allows for the manipulation of some protocol parameters to provide flexibility in transmission rates.

According to the present invention, temperature control for the communication device 200 is provided in part by manipulating the operation of the data communication protocol 224, or parameters thereof. The controller 210 uses the data communication protocol operation modification instructions 226, and temperature information provided by a temperature source, such as the temperature sensor 246, or the RF power amplifier temperature profile 222 stored in the memory 220, or both, to determine when to modify the operation of the data communication protocol 224. Accordingly, the controller 210 is responsive to the temperature information sources to reduce the operating temperature of the RF power amplifier 244 or other heat sensitive module.

Figure 3:
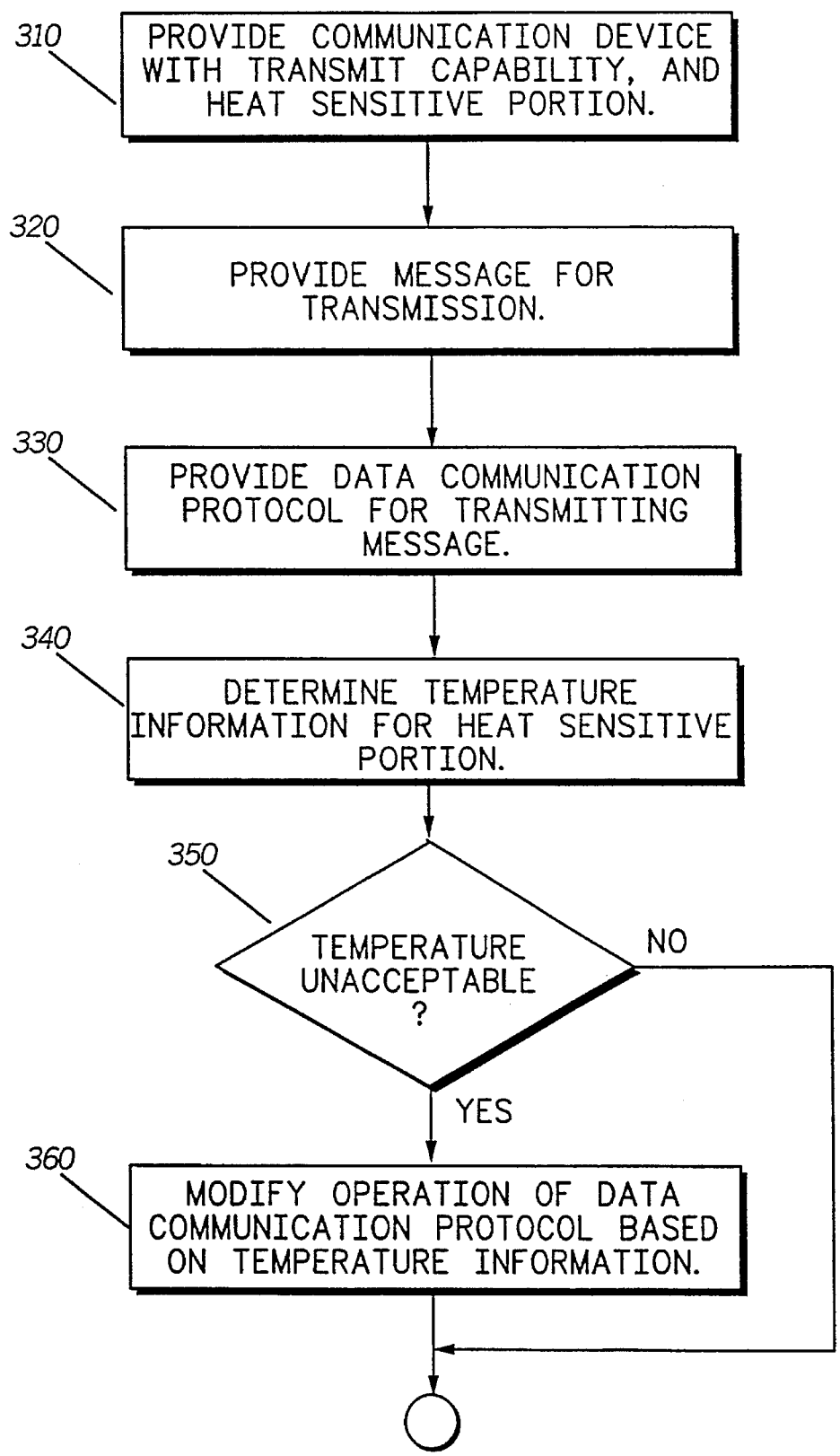
FIG. 3 is a summary of procedures used by the communication device to provide temperature control during transmissions, in accordance with the present invention.

FIG. 3 is a summary of procedures used to effectuate temperature control, in accordance with the present invention. Generally, there is provided a communication device which supports message transmissions, and which has a heat or temperature sensitive portion, which is subject to a temperature increase as a result of transmissions by the communication device, step 310. In the preferred embodiment, the heat sensitive portion comprises a radio frequency (RF) power amplifier, which can be adversely impacted by a substantial increase in temperature. Additionally, the RF power amplifier is characterized by a maximum allowed temperature of the RF power amplifier that does not overly compromise performance. Messages are provided for transmission by the communication device, step 320. The communication device is provided with a data communication protocol which operates to govern the transmission of the message, step 330. The data communication protocol has some modifiable operating parameters which determine transmission characteristics.

In operation, temperature information is determined for the temperature sensitive portion of the communication device, step 340. In one embodiment, the temperature information is provided by a temperature sensor situated in close proximity to the temperature sensitive portion of the communication device. The temperature sensor is used to measure temperature information for the power amplifier, or other temperature sensitive modules. In a second embodiment, the temperature information source is a temperature profile for the power amplifier which is determined and stored in the memory of the communication device. This temperature profile may include a history of transmissions by the communication device, as well as a characterization of the power amplifier and/or other temperature sensitive modules.

In the preferred embodiment, temperature control helps prevent the radio frequency power amplifier from exceeding a predetermined temperature. The temperature information from the temperature source is used to predict a temperature that the power amplifier would have during or at the end of transmission, if transmission of the current message was allowed to occur at a particular time. When transmission would result in an unacceptable temperature, step 350, i.e., the predicted temperature would exceed a maximum allowable temperature for the power amplifier or other temperature sensitive portion, a modification in the operation of the data communication protocol is effected through a modification of transmission parameters, step 360. Thus, the operation of the data communication protocol is dynamically modified, i.e., during or before transmission of a message, based in part on the temperature information provided to reduce the operating temperature of the RF power amplifier or other temperature sensitive portion.

Modification of the operation of the data communication protocol is performed by executing protocol operation modification instructions stored in the memory of the communication device. In one embodiment, these instructions result in the segmenting of the message into smaller packets so as to reduce periods of continuous transmissions. In another embodiment, the modified protocol parameters result in delaying the transmissions of the message or portions thereof, such as by delaying one or more data packets.

The present invention offers significant benefits over approaches using the prior art. By incorporating temperature control decisions in the data communication protocol through the modification of protocol parameters, temperature management can be performed in a seamless fashion. The approach of the present invention is particularly suitable for applications involving digital communications and corresponding data transmissions protocols which allow continuous transmissions.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of controlling device temperature, comprising the steps of:

providing a communication device supporting transmissions, and having a particular portion subject to a temperature increase resulting from the transmissions;

providing a message for transmission by the communication device;

providing a data communication protocol operating to govern a transmission of the message;

determining temperature information for at least the particular portion of the communication device; and modifying operation of the data communication protocol based at least in part on the temperature information.

2. The method of claim 1, wherein the step of determining temperature information, comprises the steps of:

providing a temperature sensor in close proximity to the particular portion of the communication device; and measuring temperature information with the temperature sensor.

3. The method of claim 1, wherein the step of determining temperature information, comprises the steps of:

providing a temperature profile for the particular portion of the communication device, the temperature profile including a relationship between transmissions and temperature increase of the particular portion; and determining temperature information from the temperature profile based on the transmissions.

4. The method of claim 3, wherein the step of providing a temperature profile, comprises the step of determining and storing a temperature profile for the particular portion of the communication device in a memory of the communication device.

5. The method of claim 3, wherein the step of providing a temperature profile comprises the steps off providing information regarding time periods of previous transmissions;

providing information regarding a heat generation rate for the particular portion of the communication device during transmission; and providing information regarding a heat dissipation rate for the particular portion of the communication device.

6. The method of claim 5, wherein the step of modifying operation of the data communication protocol, comprises the step of delaying transmission of at least a portion of the message.

7. The method of claim 6, wherein the step of delaying transmission of at least a portion of the message comprises the steps off predicting a temperature for the particular portion of the communication device that would result from a transmission; and delaying the transmission when the predicted temperature exceeds a maximum allowed temperature for the particular portion.

8. The method of claim 1, wherein the step of modifying operation of the data communication protocol, comprises the step of delaying transmission of at least a portion of the message.

9. The method of claim 1, wherein the step of modifying operation of the data communication protocol, comprises the step of segmenting the message.

10. A method of controlling temperature in a communication device, comprising the steps of:

providing a communication device supporting transmissions through a radio frequency power amplifier;

providing a message for transmission by the communication device;

providing a data communication protocol governing a transmission of the message by the communication device;

determining temperature information for the radio frequency power amplifier; and dynamically modifying operation of the data communication protocol based at least in part on the temperature information.

11. The method of claim 10, wherein the step of determining temperature information, comprises the steps off providing a temperature sensor in close proximity to the radio frequency power amplifier; and measuring temperature information with the temperature sensor.

12. The method of claim 10, wherein the step of determining temperature information, comprises the steps of:

providing a temperature profile for the radio frequency power amplifier; and determining temperature information from the temperature profile.

13. The method of claim 12, wherein the step of providing a temperature profile comprises the steps of:

providing information regarding time periods for previous transmissions;

providing information regarding a heat generation rate for the radio frequency power amplifier during transmission; and providing information regarding a heat dissipation rate for the radio frequency power amplifier.

14. The method of claim 13, wherein the step of dynamically modifying operation of the data communication protocol, comprises the step of delaying transmission of at least a portion of the message.

15. The method of claim 14, wherein the step of delaying transmission of at least a portion of the message comprises the steps of:

predicting a temperature for the radio frequency power amplifier that would result from a transmission; and delaying the transmission when the predicted temperature exceeds a maximum allowed temperature for the radio frequency power amplifier.

16. The method of claim 10, wherein the step of dynamically modifying operation of the data communication protocol, comprises the step of delaying transmission of at least a portion of the message.

17. The method of claim 10, wherein the step of dynamically modifying the data communication protocol, comprises the step of segmenting the message.

18. A communication device, comprising:

means for transmitting a message;

means for implementing a data communication protocol having parameters governing a transmission of the message;

a heat sensitive portion affected by transmission of the message;

means for determining temperature information for the heat sensitive portion; and means for modifying the data communication protocol parameters based at least in part on the temperature information.

19. The communication device of claim 18, wherein the heat sensitive portion comprises a radio frequency power amplifier.

20. A communication device operable to support a transmission of a message, comprising:

a heat sensitive portion having an operating temperature;

a temperature information source for the heat sensitive portion; a memory having a data communication protocol governing transmission of the message, and a protocol operation modification portion; and a controller coupled to the memory and to the temperature information source, the controller being responsive to the temperature information source to reduce the operating temperature of the heat sensitive portion by modification of the data communication protocol using the protocol operation modification portion.

21. The communication device of claim 20, wherein the heat sensitive portion comprises a radio frequency power amplifier.

22. The communication device of claim 20, wherein the temperature information source comprises a temperature sensor situated in close proximity to the heat sensitive portion.

23. The communication device of claim 20, wherein the temperature information source comprises a temperature profile of the heat sensitive portion stored in the memory.

24. The communication device of claim 20, wherein the protocol operation modification portion includes instructions for delaying transmission of at least a portion of the message.

25. The communication device of claim 20, wherein the protocol operation modification portion includes instructions for segmenting the message.

\* \* \* \* \*